United States Patent [19]
Nakata et al.

[11] 3,979,767
[45] Sept. 7, 1976

[54] MULTILAYER P-N JUNCTION SEMICONDUCTOR SWITCHING DEVICE HAVING A LOW RESISTANCE PATH ACROSS SAID P-N JUNCTION

[75] Inventors: Josuke Nakata; Ryuji Denda, both of Itami, Japan

[73] Assignee: Mitsubishi Denki Kabushiki Kaisha, Tokyo, Japan

[22] Filed: Sept. 20, 1973

[21] Appl. No.: 399,047

Related U.S. Application Data

[63] Continuation of Ser. No. 264,547, June 20, 1972, abandoned.

[30] Foreign Application Priority Data
June 24, 1971 Japan.............................. 46-45958

[52] U.S. Cl..................................... 357/38; 357/51; 357/67; 357/86; 357/55
[51] Int. Cl.² ................ H01L 29/74; H01L 23/48; H01L 29/06; H01L 27/02
[58] Field of Search .............. 317/234, 5, 235, 41, 317/41.1, 44; 357/28

[56] References Cited
UNITED STATES PATENTS

| | | | |
|---|---|---|---|
| 3,274,460 | 9/1966 | Pessok | 317/235 AB |
| 3,445,301 | 5/1969 | Topas et al. | 317/235 AB |
| 3,472,688 | 10/1969 | Hayashi et al. | 317/234 J |
| 3,548,269 | 12/1970 | MacDougall et al. | 357/28 |
| 3,566,210 | 2/1971 | Dececco | 317/235 AB |

FOREIGN PATENTS OR APPLICATIONS

| | | | |
|---|---|---|---|
| 1,473,005 | 2/1967 | France | 317/235 AB |
| 1,513,238 | 1/1968 | France | 317/235 AB |

Primary Examiner—Andrew J. James
Attorney, Agent, or Firm—Oblon, Fisher, Spivak, McClelland & Maier

[57] ABSTRACT

A semiconductor switching device is disclosed which includes a wafer comprising at least four semiconductive layers with adjacent layers being of opposite conductivity type to form a plurality of P-N junctions. At least part of the P-N junction between one outer layer of the four semiconductive layers and an adjacent layer is shunted by an additional layer formed in the wafer. The additional layer forms an electrical resistance path across the P-N junction, and is prepared by sintering or alloying a metal layer into the wafer material. A method of making the semiconductor switching device is also disclosed.

7 Claims, 8 Drawing Figures

MULTILAYER P-N JUNCTION SEMICONDUCTOR SWITCHING DEVICE HAVING A LOW RESISTANCE PATH ACROSS SAID P-N JUNCTION

This is a continuation of application Ser. No. 264,547, filed June 20, 1972, and now abandoned.

BACKGROUND OF THE INVENTION

1. Field of the Invention

This invention relates to a semiconductor switch having at least four adjacent semiconductive layers, such as a thyristor, and to a method of making the same.

2. Description of the Prior Art

In general, in semiconductor switches, the four adjacent semiconductive layers are arranged to be alternately of the opposite conductive type. A pair of main current-carrying electrodes (Anode and Cathode) are provided in low resistance contact with the end layers, and at least one control electrode (gate) is similarly connected to an intermediate layer. The two intermediate layers between the end layers are termed the base layers, and both end layers are called emitter layers.

A central P-N junction is formed between both of the base layers, and two outer P-N junctions are formed between each emitter layer and the adjacent intermediate base layer. THe outer P-N junctions are called the emitter junctions which are positioned on both sides of the center P-N junction. A pair of main electrodes is coupled to the emitter layers, and a gate electrode is coupled to at least one of the base layers.

The forward voltage for switching (hereinafter referred to as the switching voltage), is applied between both of the electrical terminals connected to the emitter layers. In a two terminal thyristor, when the switching voltage is forwardly applied, a high impedance state is presented until the applied voltage reaches a rated value (hereinafter referred to as the forward breakdown voltage). If the applied voltage exceeds the rated value, not only does the center P-N junction break down, but it reverses in polarization and a very low impedance state is presented between the terminals.

In a thyristor with a gate electrode, the gate current is supplied between one of the base layers, and the emitter layer adjacent to that base layer, whereby the gate current changes the break-down voltage of the device.

In general, the gate current is supplied so as to switch the thyristor from its forward blocking state to its forward conducting state. In such thyristors, it has been found that the forward blocking voltage capability is decreased by increases in junction temperature and increases in the rate of change ($dv/dt$) of applied forward voltage.

In both cases, leakage current flows across the center P-N junction, which is reversely biased in the forward blocking state. The leakage current acts as the forward current for both of the emitter junctions. Therefore, significant amounts of minority carries are injected to the base layers from the emitter layers, whereby the current amplification is increased and the forward blocking voltage capability is decreased.

It is possible to correct this decrease of forward blocking voltage capability due to increasing injection, provided the leakage current flowing to the center junction is by-passed at one of the emitter P-N junctions as as to prevent the unwanted injection caused by the leakage current.

In view of the above, a structure has been proposed and widely used wherein a part of the electrode engaging the emitter layer with low resistance also engages the base layer adjacent to the emitter layer with low resistance. This is commonly called the "shorted emitter structure".

However, disadvantageous effects are produced in passing a large leakage current from the base layer directly to the outer electrode to prevent the injection of the minority carriers from the emitter layer. More particularly, in shorted emitter thyristors having a gate electrode, the gate triggering current is increased, and thus the gate input power is disadvantageously increased. Also in this type of thyristor, in voltage triggering by applying a voltage exceeding the break-down voltage with no gate current, the current required for the break-down (break-down current) is increased, whereby excess power is dissipated resulting in the possibility of a secondary break-down-like phenomenon as is found in a conventional transistor.

Moreover, in the shorted emitter thyristors, the rate of stored carrier flow in the vicinity of the shorted area of the active base region is reduced by spreading of the turn-on region at the initiation of the forward conducting state. This is caused by flowing out of large amounts of stored carriers from the base layer directly to the outer main electrode through the emitter shunt path. As a consequence, the spreading velocity of the turn-on region is reduced and the rate of change of the current ($di/dt$) is disadvantageously described.

These disadvantages can be slightly improved by increasing the sheet resistance of the base layer and limiting the leakage current passed to the emitter junction short circuit. However, the increase in the sheet resistance of the base layer is limited from the structural viewpoint, and it is consequently hard to completely eliminate the above-described difficulties.

SUMMARY OF THE INVENTION

Accordingly, one object of this invention is to provide a novel and improved semiconductor switching device.

Another object of this invention is to provide a semiconductor switch device having an improved voltage response rate characteristic.

Yet another object of this invention is the provision of a novel semiconductor switch device having an improved current response rate characteristic.

A still further object of this invention is to provide a novel thyristor structure having an improved temperature stability.

Another object of this invention is to provide a novel method of making semiconductor switching devices.

Briefly, these and other objects and features of the present invention are attained by providing a semiconductor switch device wherein the electrode attached to the emitter layer with low resistance is not directly attached to the base layer adjacent to the emitter layer. Instead of this attachment, an additional layer is provided forming an electrical resistance path and crossing at least a part of the emitter junction.

The additional layer provides a resistive shunt to the low level leakage current passing to the center junction, and to the displacement current ($dv/dt$) without injecting the minority carriers from the emitter layer. On the other hand, it also limits the flow of gate triggering current and load current for turn-on, by by-passing the emitter junction. The disadvantages of the shorted emitter structure are thus improved by this additional layer.

In the semiconductor switch device of this invention, the additional layer forms a resistive shunt or path across the emitter junction having a negative temperature coefficient of resistance, whereby the resistance of the path decreases with rising temperature, so as to increase the current by-passing the emitter junction and decrease emitter junction efficiency. This function increases the high-temperature forward blocking voltage capability of semiconductor switching devices and also improves their voltage response rate characteristic.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying Drawings, wherein.

DESCRIPTION OF THE PREFERRED EMBODIMENT

Figure 1:
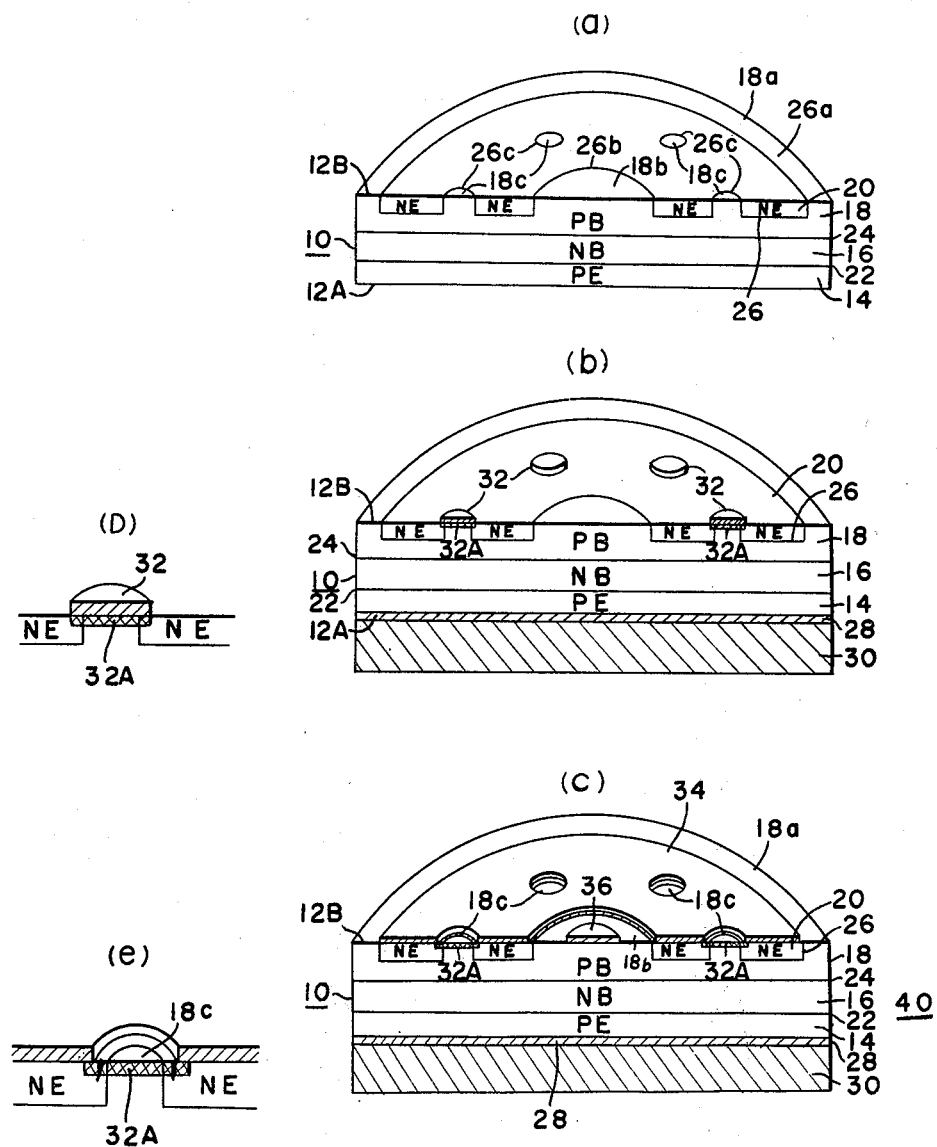
FIGS. 1(a), 1(b), 1(c), 1(d), and 1(e) are, respectively sectional schematic views of the structure of the present invention at each stage of the process of preparing the semiconductor switch device in accordance with this invention.

Referring now to the Drawings, wherein like reference numerals designate identical or corresponding parts throughout the several views, and more particularly to FIG. 1(a) thereof, a semiconductor material wafer 10 is shown. This wafer may be formed from a semiconductor material such as silicon or germanium, and includes a lower principal surface 12A and an upper principal surface 21B. The wafer is doped so as to form four contiguous regions 14, 16, 18 and 20.

In forming a wafer of this structure, a high resistivity N-type silicon disc is first provided. A P-dopant, such as gallium, is diffused into the N-disc to a depth of approximately $90\mu$, so as to form P-layers 14 and 18 on either side of an undoped N-layer 16. The surface concentration of P-type layers 14 and 18 is about $2 \times 10^{18}$ ($1/cm^3$). The P-N-P wafer is then diffused with an N-dopant, such as phosphorous to a depth of about $20\mu$, to selectively form an N-type layer 20 within the P-type layer 18. The surface concentration of phosphorus is about $5 \times 10^{20}$ ($1/cm^3$) after completion of the diffusing step. However, N-doping does not occur within the six small circular portions 18c.

The first region 14, designated $P_E$, is a region of P-conductivity and functions as the emitter region. This region is exposed to one surface 12A of the wafer. A second region 16, designated $N_B$, is of an N-conductivity, and is formed parallel to and contiguous with the first region 14, so as to form a P-N junction 22, which is designated as the anode emitter. A third region 18, designated as the base $P_B$, is formed parallel to and contiguous with the second region 16 and is of a P-conductivity type. This third region 18 forms a P-N junction 24 with the second region 16, which will be referred to as the center junction. A fourth region 20, designated $N_E$, is of an N-conductivity type and is formed within the third region 18 so that both the $P_B$ region 18 and the $N_E$ region 20 are exposed to the wafer surface 12B. This fourth region 20 functions as the cathode emitter region and forms a P-N junction 26 with the third region 18, which will be referred to as the cathode emitter junction.

The regions 18 and 20 are formed such that the surface 12B includes a central portion 18b of P-conductivity, surrounded concentrically by an annular ring 20 of N-conductivity which, in turn, is surrounded concentrically by an annular ring 18a of P-conductivity. In forming the $N_E$ region 20 within the $P_B$ region 18, a suitable dopant is selectively diffused into the $P_b$ region to convert portions of this region to N-conductivity type. However, the six small circular portions 18(c) (only four shown) in the annular N-conductivity ring 20 are permitted to remain of P-conductivity type. That is, as mentioned above, N-doping does not occur within these six small P-conductivity portions 18(c).

A molybdenum disc 30 is then fixed to the surface 12A of the wafer by means of an aluminum silicon alloy layer 28 as shown in FIG. 1(b) to form a low resistance contact. This is accomplished by placing an aluminum foil over the surface 12A, contacting the molybdenum disc 30 to the foil, so as to lodge the foil between the plate and the surface 12A of the wafer, and then heating the combination at a temperature of 660°–700°C. in vacuo for 20 minutes or more whereby the aluminum-silicon alloy layer 28 is formed which bonds the molybdenum to the wafer surface 12A.

The surface 12B of the wafer is then selectively metallized with aluminum so that an aluminum covering of a thickness of 3 – 8 $\mu$ is formed only over each of the small circular portions 18(c). This can be performed using conventional vacuum deposition techniques with appropriate masking. After deposition, the aluminum is heated at 550°–700°C. for about 20 minutes in a vacuum. As a result, additional layers 32A of sintered or alloyed aluminum are formed beneath the small circular portions 18(c). The additional layers 32A extend outwardly from the small circular portions 18(c), and overlap on the surrounding N-type material in region 20. Any aluminum not entering the additional layer 32A is subsequently etched away, although the additional layer 32A remains.

A second aluminum layer is then deposited on the surface 12B of 3–8$\mu$ thickness by conventional selective vacuum deposition techniques, and is subsequently heated at 550°–560°C. for several minutes. The second aluminum layer is formed into an annular area 34, having apertures therethrough at the locations of the small circular portions 18(c), and a circular area 36 positioned at the center of the annular area 34, as shown in FIG. 1c). The above-mentioned heating causes the aluminum to be sintered to the wafer material, resulting in the formation of low resistance contacts between the aluminum and the wafer material. Thus, the annular aluminum area 34 forms a low resistance contact with the N-type region 20, while the circular aluminum area 36 forms a low resistance contact with the P-type region 18(b).

The completed thyristor unit 40 is shown in FIG. 1(c), wherein the molybdenum disc 30 serves both as an anode and to reinforce the wafer structure. The aluminum layer 34 serves as the cathode and the aluminum layer 36 serves as the gate electrode. The completed device is encapsulated in an appropriate package (not shown) for commercial distribution.

Figure 2:
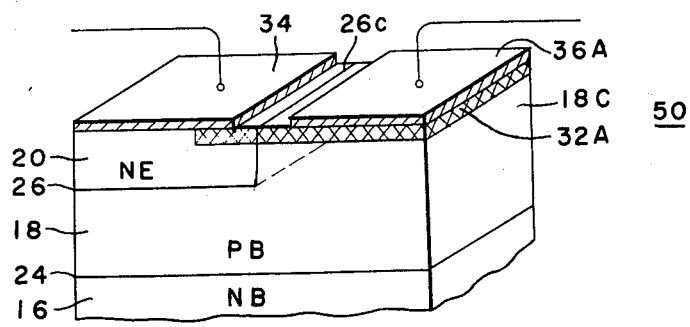
FIG. 2 is a sectional schematic view of an experimental structure used to test the characteristics of the device illustrated in FIG. 1; and, FIGS. 3(a) and 3(b) are voltage-current characteristic curves for the semiconductor switch device of FIG. 2 at normal temperature and at an elevated temperature, respectively.

FIG. 2 is a schematic view of an equivalent structure 50 used in measuring the characteristics of the thyristor 40, particularly in the region of one of the small P-conductivity portions 18c. In FIG. 2, the P-conductivity portion 18c is shown as being rectangular in configuration, whereas the equivalent portions in FIGS. 1(a)–1(c) were illustrated as circular in configuration. The layer 32A shown by the cross-latching is the same type of aluminum alloy layer as was formed beneath the wafer surface in the device of FIGS. 1(a)–1(c). It is quite critical that this layer cross the line 26c which illustrates a portion of the emitter junction 26. The cathode is again shown at 34 in FIG. 2, while a rectangular gate electrode 36A is shown in place of the circular gate electrode 36 of FIG. 1(c).

Figure 3A:
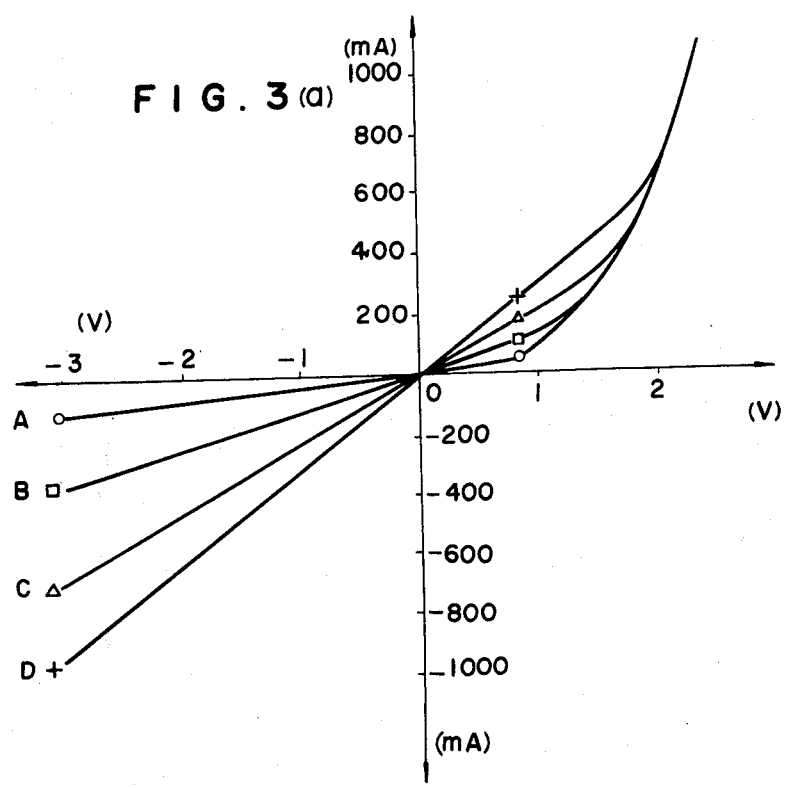

FIGS. 3(a) and (b) each show the voltage-current characteristic curves across the emitter junction 26 for a device as illustrated in FIG. 2. The abscissa of these curves is the voltage applied across the electrodes contacted with aluminum layers 34 and 36A. The ordinate shows current flow between the electrodes.

FIG. 3(a) shows the characteristic curves at room temperature and FIG. 3(b) shows the characteristic curves at 120°C. Curve A is the characteristic curve for a thyristor device, except without the subaluminum layer 32A. The curve B is the characteristic curve for a thyristor device with the layer 32A formed across the emitter junction 26, in accordance with the embodiment of FIG. 1.

As is clear in FIGS. 3(a) and 3(b), a certain leakage current flows in the backward direction and the resistive component of the current flows in the forward direction, even though the layer 32A is not in existance. However, when the layer 32A is formed, the leakage current in the backward direction is increased and the resistive component of the current is increased as shown in the curve B.

The curve B has characteristics similar to what would occur if a resistance were bridged across the P-N junction surface. Accordingly, the layer 32A provides the equivalent of resistive channels across the surface 26c of the emitter junction. Thus, while in the embodiment shown in FIG. 1 the emitter junction 26 is not directly short-circuited by the aluminum layer 34 used as a cathode, the part 26c of the emitter junction has the equivalent of resistive channels or a resistive shunt 32A across it. This fact is quite important.

The curve C and the curve D shown in FIGS. 3(a) and 3(b) are respectively the characteristics of the device of the present invention prepared with different heating of the aluminum layer 32 in comparison with the heating represented by the curve B. More specifically, the curve C is for a device prepared by heating at about 625°C. for about 10 minutes, and the curve D is for a device prepared by heating at about 675°C. for about 5 minutes. The heat treatment is carried on in a vacuum, as in the case represented by the curve B.

The temperature of 550°–560°C. which is used in preparing a device having the characteristic curve B is the temperature for sintering aluminum to silicon, and an aluminum-silicon alloy is not formed. However, an alloy of aluminum and silicon is no doubt formed at the temperatures for preparing devices having the characterics curves C or D. It will be understood that devices having the characteristic curves C or D have the same or a greater effect than those of the characteristic curve B.

In comparing the curves B, C and D, it will be seen that the resistivity of the additional layer 32A in each case has a different value. It will be understood, therefore, that the resistivity of the additional layer 32A depends up on the heating of the aluminum 32, i.e., depends upon the temperature and the duration of the heating.

It will also be understood that suitable electric resistance paths by additional layers can be provided even to devices having different characteristics. In addition, when the heating condition for joining the molybdenum disc 30 and the heating condition of the aluminum layer 32 for providing the electric resistance path 32A can be selected to be similar or identical to each other, both heating operations can be carried out at one time.

The effect of this structure on voltage response rate $(dv/dt)$ will now be discussed in detail. The forward switching voltage is applied between the anode (molybdenum dics 30) and the cathode (aluminum layer 34). The voltage response characteristic $dv/dt$ is important when the switching voltage is applied such that the anode is positive. When the applied voltage is rapidly increased in this polarity, i.e., the applied voltage has a high rate of change $(dv/dt)$, the displacement current flows to the center junction 24, since only the center junction 24 is back biased by the application of this forward blocking voltage. Because of the additional layer 32A formed across the emitter junction 26c, the displacement current is shunted by the resistive path 32A. Therefore, the injection efficiency of the emitter junction is kept at a low level.

If no additional resistive layer is provided at the part 26c of the emitter junction 26, the displacement current flows from the P-type base layer 18 through the emitter junction 26 to the N-type emitter layer 20, whereby the electron carriers may be injected from the N-type emitter layer 20 at high injection efficiency. However, the additional layer 32A formed across a part of the emitter junction causes a reduction in the injection efficiency in the N-type emitter layer 20, whereby the rate of voltage change $(dv/dt)$ is increased.

Attention is now directed to a consideration of the effect of the present invention on the gate input power required for triggering. The gate input power is applied between the gate electrode (aluminum layer 36) and the cathode electrode (aluminum layer 34). When a sufficient gate current flows from the gate to the cathode, the thyristor is switched to its conductive state. In conventional thyristors with the above described shorted emitter structure, the cathode is connected across the part 26c of the emitter junction, except in the neighborhood of the gate electrode, whereby the gate current is able to flow through the short-circuit of the part 26c. Accordingly, the carrier injection from the N-type emitter layer 20 by the gate current is substantially zero at the part 26c. Therefore, the injection efficiency by the gate current at all parts of the emitter junction 26 is remarkably reduced, whereby a high gate input power is required.

However, in the embodiment of the present invention shown in FIG. 1; the additional layer 32A formed at the part 26c does not provide a short-circuit path across the junction 26. Thus, when a gate current above a specific value flows, the electron injection from the N-type emitter layer 20 results. Accordingly, it is possible to supply minimum gate input power with the structure of the present invention.

The effect of the present invention on current response characteristics ($di/dt$) will now be discussed in detail. This problem arises in turning on the thyristor device. At the initiation of the turn-on process, only a small area of the N-type emitter 20 switches to the "on" state, and the "turn-on" area then spreads across the entire N-type emitter area 20. When a large load current flows before the turn-on area has spread sufficiently, the current is concentrated in a small turn-on area, creating a localized overload which can permanently damge the thyristor device. The likelihood of damage is great when a large current suddenly flows at the instant of turn-on. This is called current change rate ($di/dt$) destruction.

In order to improve the capability of a thyristor for handling rapid applications of load current, it is necessary to rapidly enlarge the turn-on region to the entire area of the thyristor device. For this purpose, it is necessary to accumulate a sufficient supply of excess carriers in the P-type base layer 18. The excess carriers accumulated in the P-type base layer operate to promote carrier injection from the N-type emitter layer 20 by supplying carriers to the turned-on region. The additional layer 32A added to the part 26c of the emitter junction 26 produces a much greater accumulation of excess carriers in the P-type base layer 18 in comparison with the shorted emitter structure, whereby the current change rate ($di/dt$) capability of the thyristor is greatly improved.

Figure 3:
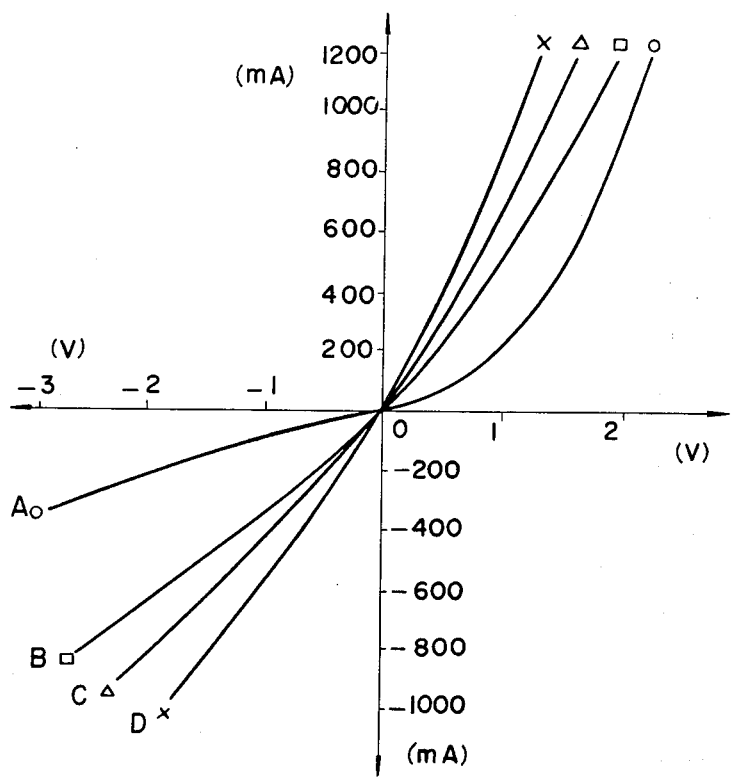

Attention is now directed to a consideration of the temperature dependency characteristics of a thyristor according to the present invention. In the comparison of the curves B shown in FIGS. 3($a$) and 3($b$), it is significant that the curve B shown in FIG. 3($b$) indicates a higher current flow than that of FIG. 3($a$) under the same voltage in the forward direction. FIG. 3($a$) shows the characteristic at room temperature, while FIG. 3($b$) shows the characteristic at a junction temperature of 120°C. Accordingly, it is clear that the additional resistive layer 32A added to the part 26c has a negative temperature dependence. Thus, the electric resistance of the channel changes to provide lower resistance, with rising temperature, to gradually permit larger ohmic currents to flow. This increase in the ohmic current through the resistive channel due to rising temperature causes a gradual decrease in the injection rate of carriers from the N-type emitter layer 20 into the P-type base layer 18 with rising temperature. This in turn reduces the decrease in the forward blocking voltage capability of the thyristor device 40 caused by rising temperature. Accordingly, the device 40 has the characteristic of being quite stable over a wide range of temperatures.

It is important to note that additional layer 32A added to the part 26c is built into the semiconductive wafer 10. Accordingly, the additional layer 32A undergoes precisely the same temperature change as the wafer 10, to accurately compensate for changes in temperature.

A device similar to that shown in FIG. 1 can also be prepared by another process, as will now be described. In this process, a wafer 10 as shown in FIG. 1($a$) can be used. The molybdenum plate 30 is first joined to the wafer 10. The joining process can be accomplished by the same process described with regard to FIG. 1($b$). The process includes the step heating at 660°–700°C. in a vacuum for about 10 minutes with aluminum foil being inserted between the surface 12A of the wafer 10 and the molybdenum plate 30. After finishing the joining of the molybdenum plate 30, the aluminum layer is vapor-coated on the surface 12B of the wafer 10. An aluminum layer then covers all of the small circular portions 18c, and most of the surface of the N-type emitter. The thickness of the aluminum layer is again in the range of about 3–8$\mu$.

The aluminum layer on the surface 12B of the wafer 10 is subsequently heated at 550°–700°C. in a vacuum for at least several minutes so as to be sintered or alloyed in the wafer 10. As a result, an additional layer of silicon containing aluminum similar to the layer 32A is formed in the wafer 10 beneath each small circular portion 18c and beneath the remaining area of the N-type emitter layer 20. Then, the aluminum layer remaining on the surface 12B is removed by etching only in the limited area of each small circular portion 18c and a small part of the N-type emitter layer 20 around the portions 18c.

The aluminum layer on the emitter layer 20 thus remains, except in this limited etched area, and is used as the cathode. The gate electrode 36 can be prepared by vapor-coating aluminum at the same time as the above-described vapor-coating of aluminum.

The device prepared according to the above process has an additional layer of silicon containing aluminum in the part of the wafer beneath the cathode 34. Thus, current from the anode 30 to the cathode 34 may pass through this additional layer. However, the additional layer is quite thin and the increase in the electric resistance is thus quite small, and causes no difficulty.

Numerous modifications of the device illustrated in the Drawings and described hereinbefore are also possible. For example, although the additional layer 32A may be formed by sintering or forming an alloy with the aluminum layer 32 in the device shown in FIG. 1, it is possible to replace the aluminum layer with a layer of another metal such as nickel, platinum, cobalt, copper, tungsten, molybdenum, or titanium.

Furthermore, although the electrical resistance path 32A is added to the part 26c in the device shown in FIG. 1, it is alternatively possible to add the electric resistance path to the other exposed parts 26a or 26b of the emitter junction 26. When the resistance path is added to the parts 26a or 26b, the layer of aluminum or other metal is shaped as a ring to cover the parts 26a or 26b, and is heated together with the silicon. The element shown in FIG. 1 has the "center gate" structure wherein the gate electrode is provided at the center of the wafer 10. In this type of device, it is preferable to provide the resistance path to the part 26c or the part 26a. However, it is not desirable to provide it to the part 26b, since when the resistance path is added to the part 26b, it causes cancellation of the forward bias function of the gate current to the emitter junction 26. However, when the gate electrode is provided on the outer peripheral exposed part 18a of the P-type base layer 18, forming a "ring gate" structure, it is preferable to add the resistance path to either the part 26c or the part 26b.

It is also possible to reverse the types of conductive material used in each layer from those shown in FIG. 1.

A thyristor which has no gate electrode can also be constructed. This type of thyristor is basically the device shown in FIG. 1, except having no aluminum layer 36. The other parts can be prepared by the method described hereinabove, and it is possible to add the resistance path to part 26a 26b, or 26c. The resistance path then results in a decrease in the current required for break-down in comparison with conventional shorted emitter structures.

This invention can also be applied to two directional thyristors or other similar types of switching devices, wherein it is possible to obtain similar effects by providing the resistance path to a part of the emitter junction, as stated above.

It should now be apparent that the device of this invention provides a decrease in the gate input power necessary to trigger a thyristor device, and also improves the voltage rate response characteristics of such devices. The present invention also provides a decrease in the power required for break-down in two terminal thyristors, and improves the current response rate characteristics of both types of devices. It should be further apparent that the device of this invention, having the additional layer which has a negative temperature coefficient of resistance, has the further characteristic of being stable even in rising temperatures. Finally, it should also be apparent that the process of this invention has the advantage of easily and accurately preparing an additional layer for the resistance path.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor switching device comprising:
   a first semiconductor layer,
   a second semiconductor layer engaging said first semiconductor layer and forming a first P-N junction therebetween,
   a third semiconductor layer engaging said second semiconductor layer and forming a second P-N junction therebetween,
   a fourth semiconductor layer engaging said third semiconductor layer and forming a P-N junction therebetween,
   an additional semiconductor layer extending across at least a portion of said third P-N junction for providing an electrically resistive path thereacross, said additional layer comprising a metal selected from the group consisting of Al, Ni, Pt, Co, Cu, Mo and Ti,
   a first main electrode forming a contact with said first semiconductor layer,
   a second main electrode forming a physical and electrical contact with said fourth semiconductor layer without forming a physical contact with said third semiconductor layer.

2. A semiconductor switching device as in claim 1 wherein said additional layer has a negative temperature coefficient of resistance.

3. A semiconductor switching device as in claim 1 further including a third electrode which forms a contact with said third semiconductor layer.

4. A semiconductor switching device as in claim 1 wherein said additional layer is comprised of an aluminum alloy.

5. A semiconductor switching device as in claim 1 wherein said second main electrode is comprised of aluminum.

6. A semiconductor switching device as in claim 3 wherein said third electrode is comprised of aluminum.

7. A semiconductor switching device as in claim 3 wherein the second main electrode serves as a cathode and the third electrode serves as a gate.

* * * * *